(12) United States Patent
Borth

(10) Patent No.: US 12,791,198 B2
(45) Date of Patent: Nov. 10, 2026

(54) HEAT GUARD

(71) Applicant: LAM RESEARCH CORPORATION, Fremont, CA (US)

(72) Inventor: Andrew Borth, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 100 days.

(21) Appl. No.: 18/854,754

(22) PCT Filed: Apr. 14, 2023

(86) PCT No.: PCT/US2023/018592
§ 371 (c)(1),
(2) Date: Oct. 7, 2024

(87) PCT Pub. No.: WO2023/205039
PCT Pub. Date: Oct. 26, 2023

(65) Prior Publication Data

US 2025/0251140 A1 Aug. 7, 2025

Related U.S. Application Data

(60) Provisional application No. 63/334,016, filed on Apr. 22, 2022.

(51) Int. Cl.
*H10P 72/00* (2026.01)
*F24C 15/36* (2006.01)

(52) U.S. Cl.
CPC .......... *F24C 15/36* (2013.01); *H10P 72/0402* (2026.01)

(58) Field of Classification Search
None
See application file for complete search history.

(56) References Cited

U.S. PATENT DOCUMENTS

| | | | | |
|---|---|---|---|---|
| 2003/0124820 | A1 | 7/2003 | Johnsgard et al. | |
| 2008/0169038 | A1 * | 7/2008 | Sellis | F16L 59/022 138/159 |
| 2014/0029925 | A1 | 1/2014 | Smith et al. | |
| 2016/0044839 | A1 | 2/2016 | Akahane et al. | |
| 2017/0106973 | A1 * | 4/2017 | Baden | B64C 25/36 |
| 2020/0008316 | A1 | 1/2020 | Cola et al. | |
| 2022/0110230 | A1 | 4/2022 | Borth et al. | |

OTHER PUBLICATIONS

International Search Report and Written Opinion of the ISA issued in PCT/US2023/018592, mailed Aug. 2, 2023; ISA/KR.

* cited by examiner

*Primary Examiner* — Xiaobei Wang

(57) ABSTRACT

A guard configured to be installed around a component includes a body made of a flexible metal material and including first and second sides and first and second ends. A first connector is arranged at the first end of the body. A second connector is arranged at the second end of the body. A plurality of rigid portions extend from the first side to the second side, wherein the plurality of rigid portions includes a plurality of spacing flanges arranged on the first side and the second side. A plurality of second portions extend from the first side to the second side. The plurality of rigid portions and the plurality of second portions alternate between the first end and the second end.

20 Claims, 5 Drawing Sheets

HEAT GUARD

CROSS-REFERENCE TO RELATED APPLICATIONS

This application is a U.S. National Phase Application under 35 U.S.C. 371 of International Application No. PCT/US2023/018592, filed on Apr. 14, 2023, which claims the benefit of U.S. Provisional Application No. 63/334,016 filed on Apr. 22, 2022. The entire disclosures of the above applications are incorporated herein by reference.

FIELD

The present disclosure relates to heat guards for protecting a component and more particularly to heat guards that surround the component.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to treat substrates such as semiconductor wafers. Examples of substrate treatments included deposition, etching, cleaning and/or other substrate treatments. The substrate processing systems typically include a processing chamber including a substrate support and a gas delivery system. Substrates are delivered to the substrate support and the gas delivery system supplies one or more process gases to the processing chamber.

In some applications, the substrate support includes resistive heaters to control the temperature of the substrate during processing. In some examples, radio frequency (RF) plasma may be generated to cause chemical reactions to occur. The substrate processing system may also include a pump to evacuate reactants from the processing chamber and exhaust lines connecting the pump to an exhaust system.

External components of the substrate processing system may be heated to a relatively high temperature during operation. The high temperature of the external components may cause damage to wires or other external components that contact the heated component. The heated components may also pose a hazard for technicians working on or near the substrate processing system.

In some substrate processing systems, a guard is designed to surround the heated component. The guard is typically designed as a single piece and then split into multiple pieces. The multiple pieces of the guard are connected around the external component, aligned, and welded and/or connected together. This approach is relatively expensive, the guard cannot be removed and reinstalled easily, and is less adaptable to changes in the surrounding components.

SUMMARY

A guard configured to be installed around a component includes a body made of a flexible metal material and including first and second sides and first and second ends. A first connector is arranged at the first end. A second connector arranged at the second end. A first plurality of spacing flanges extend in a first direction from a first side of the body. The first plurality of spacing flanges have a predetermined spacing along the first side. A second plurality of spacing flanges extend in the first direction from a second side of the body. The second plurality of spacing flanges on the second side are aligned with the first plurality of spacing flanges on the first side. A first plurality of openings in the body is arranged between pairs of the first plurality of spacing flanges and the second plurality of spacing flanges. A second plurality of openings extend inwardly from the first side of the body and arranged between the first plurality of spacing flanges. A third plurality of openings extend inwardly from the second side of the body and arranged between the second plurality of spacing flanges. A fourth plurality of openings in the body is arranged between pairs of the second plurality of openings and the third plurality of openings. The first and second ends are configured to flex towards each other to create an annular shape around the component.

In other features, the first connector includes first and second mounting flanges extending in a second direction from the body. The second connector includes first and second mounting flanges extending in the second direction from the body, wherein the second direction is opposite to the first direction.

In other features, a first portion extending from the second end of the body. A spacing flange extends in the first direction from the first portion. When the body is wrapped around the component, the first portion is arranged between the first end of the body and the component. When the body is wrapped around the component, the first connector and the second connector are connected.

In other features, the first plurality of spacing flanges have a first height. The second plurality of spacing flanges have a second height. The first height is the same as the second height.

In other features, the first plurality of spacing flanges has a first height, the second plurality of spacing flanges has a second height, and the first height is different than the second height.

In other features, the first plurality of spacing flanges has a rectangular shape and include an opening and a protrusion extending from one side thereof. The body includes one or more recesses defined in at least one of the first end and the second end to provide clearance for a connection to the component. The guard is configured to be installed on the component without breaking the connection to the component.

A guard configured to be installed around a component includes a body made of a flexible metal material and including first and second sides and first and second ends. A first connector is arranged at the first end of the body. A second connector is arranged at the second end of the body. A plurality of rigid portions extend from the first side to the second side, wherein the plurality of rigid portions includes a plurality of spacing flanges arranged on the first side and the second side. A plurality of second portions extend from the first side to the second side. The plurality of rigid portions and the plurality of second portions alternate between the first end and the second end.

In other features, the plurality of spacing flanges includes a first plurality of spacing flanges extending in a first direction from a first side of the body. The first plurality of spacing flanges has a predetermined spacing along the first side. A second plurality of spacing flanges extend in the first direction from a second side of the body. The second plurality of spacing flanges on the second side are aligned with the first plurality of spacing flanges on the first side.

In other features, the plurality of rigid portions further includes a first plurality of openings in the body arranged between pairs of the first plurality of spacing flanges and the second plurality of spacing flanges. The plurality of second portions includes a second plurality of openings extending inwardly from the first side of the body and arranged between the first plurality of spacing flanges. A third plurality of openings extending inwardly from the second side of the body and arranged between the second plurality of spacing flanges.

In other features, the plurality of second portions includes a fourth plurality of openings in the body arranged between pairs of the second plurality of openings and the third plurality of openings. The first connector includes a flange extending in a second direction from the body. The second connector includes a flange extending in the second direction from the body.

In other features, a first portion extends from the second end of the body. A spacing flange extends in the first direction from the first portion. When the body is wrapped around the component, the first portion is arranged between the first end of the body and the component. When the body is wrapped around the component, the first connector and the second connector abut.

In other features, the first plurality of spacing flanges has a first height, and the second plurality of spacing flanges has a second height. The first height is the same as the second height. The first height is different than the second height.

In other features, the first plurality of spacing flanges has a rectangular shape and include an opening and a protrusion extending from one side thereof. The body includes one or more recesses defined in at least one of the first end and the second end to provide clearance for a connection to the component. The guard is configured to be installed without breaking the connection to the component.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A heat guard according to the present disclosure includes body that can be shipped flat and formed/flexed around a component on location and then opposite ends of the heat guard are fastened together. In some examples, the heat guard includes recesses allowing installation without breaking fluid, gas and/or electrical connections to the component. For example, the heat guard can be installed around a component of a substrate processing system such as an exhaust foreline or around a component of another system. While the example below relates to heated components, the heat guard can also be arranged around chilled components or delicate components.

The heat guard is formed/flexed by hand into an annular shape around the component. Spaced flanges that extend radially inwardly from the side surfaces of the body limit localized bending to ensure that the component bends uniformly into the annular shape when formed/flexed. Once the heat guard is arranged around the component, connectors such as flanges extending radially outwardly from opposite ends of the heat guard are connected using fasteners.

The pattern and shape of openings in the body and the flanges on the side surfaces allow the heat guard to be bent and flexed around the component in a first direction while remaining stiff in a second direction transverse to the first direction. The openings in the body allow convection to reduce the temperature of the heat guard in high temperature applications. The heat guard has the ability to change its as-manufactured shape to conform to the shape of another component (e.g., foreline).

Accordingly, the heat guard can be called a compliant heat guard of which the as-manufactured shape can conform to the shape of another component (e.g., foreline).

Figure 1A:
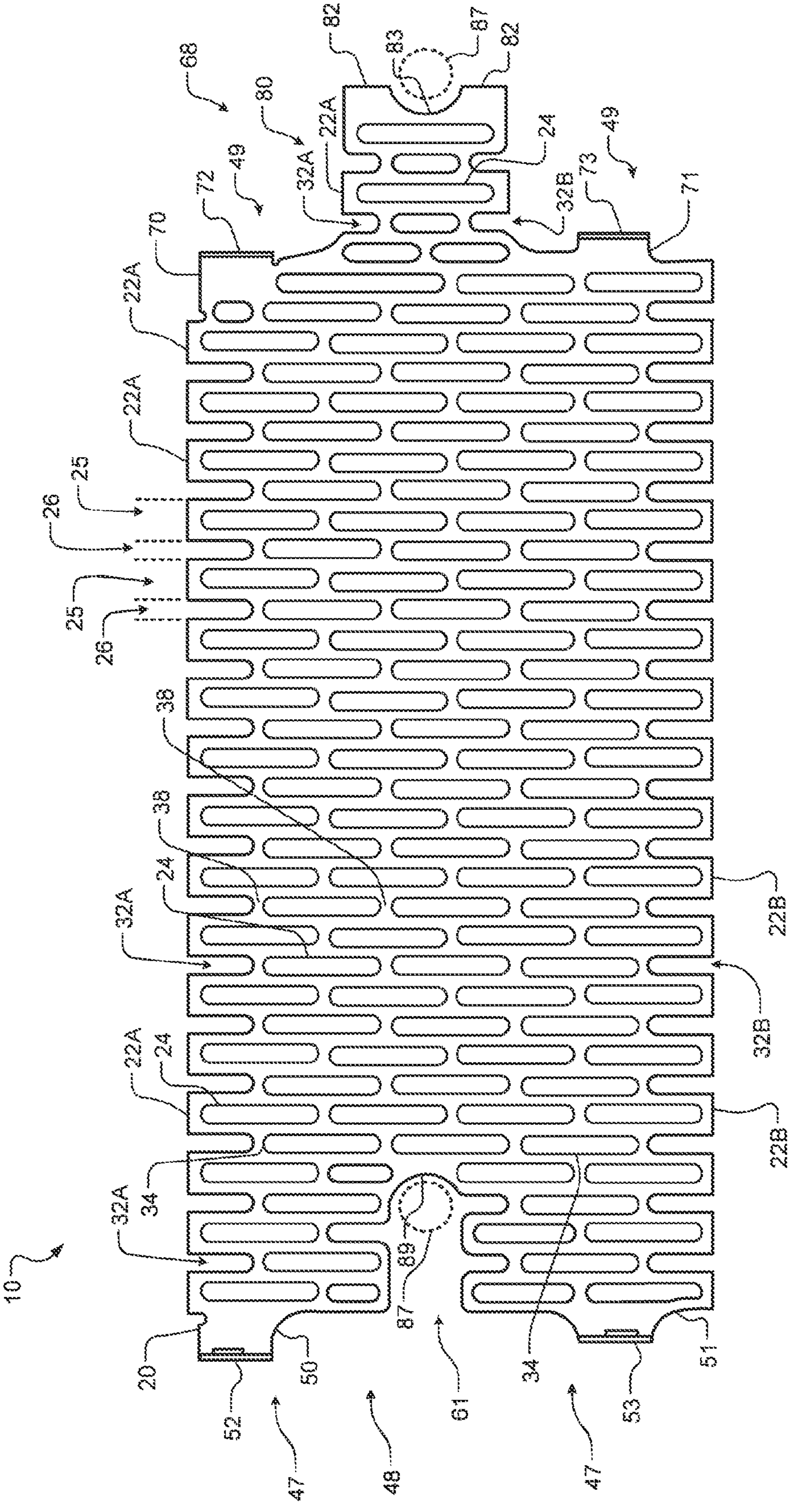
FIG. 1A is a plan view of an example of a heat guard according to the present disclosure.
Figure 1B:
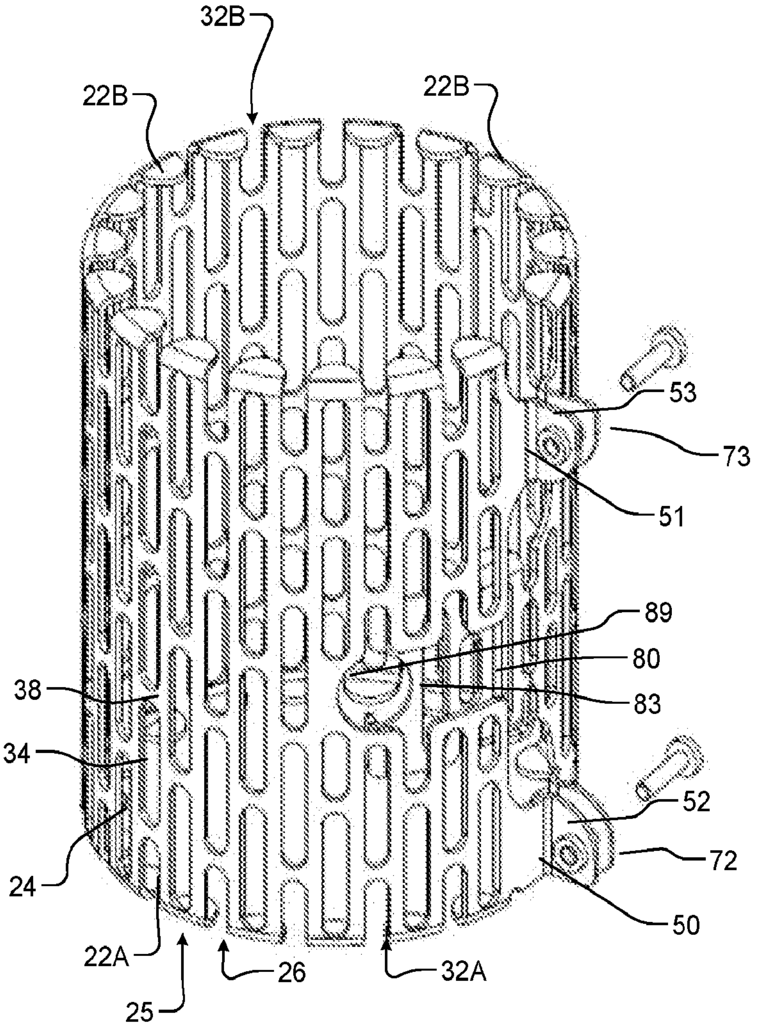
FIG. 1B is a simplified drawing showing the heat guard formed/flexed into an annular shape.
Figure 2:
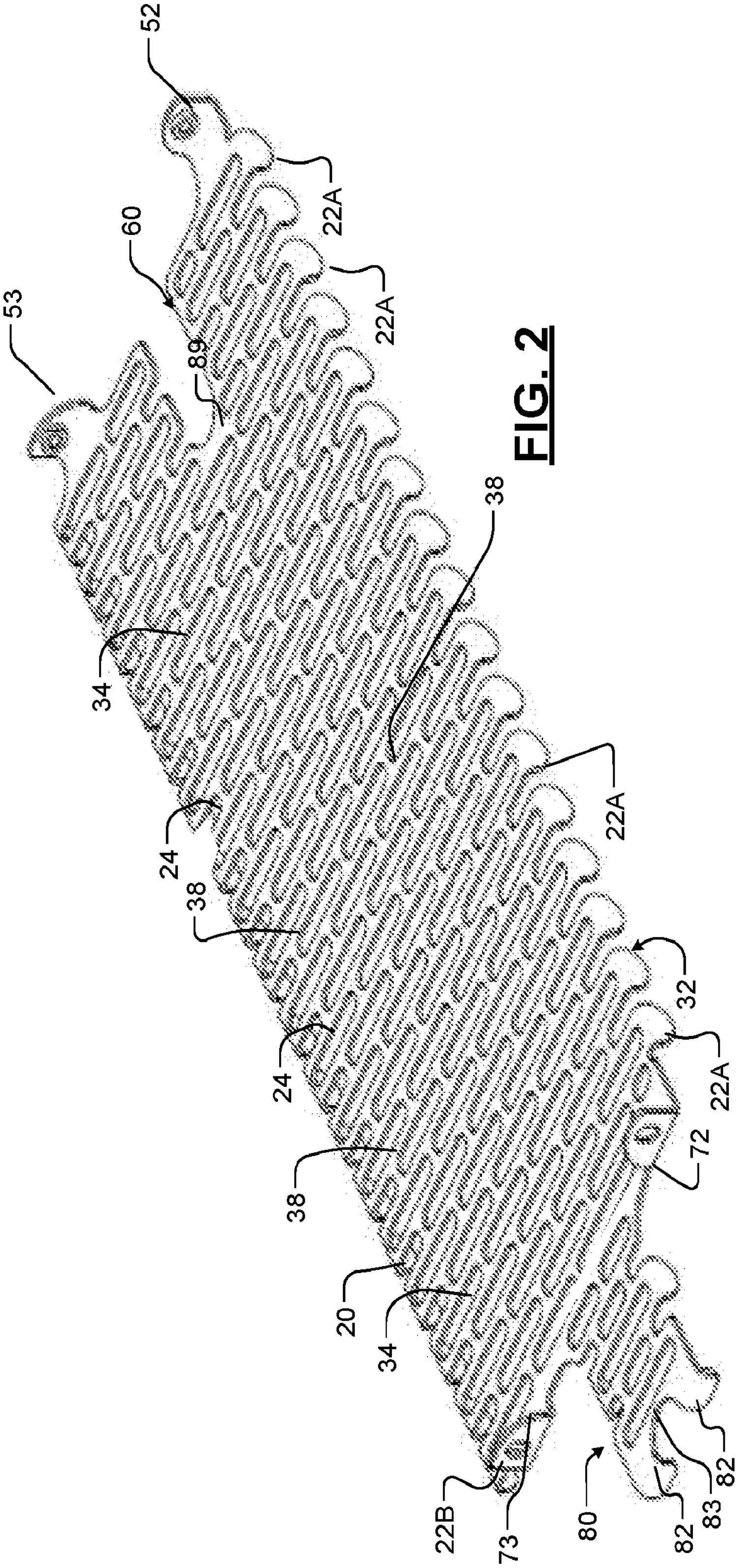
FIG. 2 is a perspective view of an example of the heat guard of FIG. 1A.

Referring now to FIGS. 1A, 1B and 2, a compliant heat guard is shown. In FIGS. 1A and 2, the compliant heat guard 10 includes a body 20 that is shown in an uninstalled state and is generally flat. As will be described further below, the body 20 includes alternating rigid portions 25 and compliant portions 26 extending between the side surfaces to allow the compliant heat guard to be formed/flexed into an annular shape (as shown in FIG. 1B).

In some examples, the body 20 is made of stainless steel, aluminum or another flexible metal material. Connectors such as flanges extending radially outwardly from opposite ends of the body 20 are connected and later disconnected if the compliant heat guard needs to be removed. The complaint heat guard returns to a generally flat shape when removed from the component. The compliant heat guard 10 can be transported in a generally flat state as shown and then wrapped around the component (in some cases without disconnecting fluid, gas or electrical connections) as shown. The compliant heat guard 10 can be installed, removed and then reinstalled in the same location or a different location as needed.

In FIG. 1A, the body 20 includes a first plurality of flanges 22A and a second plurality of flanges 22B (collectively or individually referred to as the plurality of flanges 22) arranged on opposite sides of the body 20. When the body 20 is wrapped around a heated component, the plurality of flanges 22 extends radially inwardly from a first side of the body 20. The first plurality of flanges 22A are spaced from one another by a predetermined distance.

The second plurality of flanges 22B are spaced from one another by the predetermined distance along a second side surface of the body 20. In some examples, the flanges 22 extend at a predetermined angle relative to the body 20. In some examples, the predetermined angle is approximately 90° relative to plane including the body 20 (when in the uninstalled state), although other angles can be used.

Pairs of the first plurality of flanges 22A (on the first side of the body 20) and the second plurality of flanges 22B (on the second side of the body 20) are vertically aligned. A first plurality of openings 24 are arranged and vertically aligned between each of the pairs of the first plurality of flanges 22A and the second plurality of flanges 22B, respectively. In some examples, the first plurality of openings 24 have a rounded rectangular shape with a longer side extending vertically in FIG. 1A between the pairs of the first plurality of flanges 22A and the second plurality of flanges 22B.

In some examples, the first plurality of openings 24 have a horizontal width in FIG. 1A in a second direction that is transverse to the first direction in a predetermined range between 1/16" and ½" (e.g., ¼"), although other widths may be used. In some examples, the first plurality of openings 24 have longitudinal length that is 2 to 20 times the width, although other lengths can be used.

The body 20 further includes a second plurality of openings 32A and a third plurality of openings 32B (collectively or individually referred to as the plurality of openings 32) that extend inwardly from the first and second sides of the body 20, respectively. The second plurality of openings 32A and the third plurality of openings 32B are located between adjacent ones of the pairs of the first plurality of flanges 22A and the second plurality of flanges 22B. A fourth plurality of openings 34 are arranged and vertically aligned between each of the pairs of the second plurality of openings 32A and the third plurality of openings 32B. In some examples, the first plurality of openings 24 and the fourth plurality of openings 34 have approximately the same dimension, although different orientations and/or dimensions can be used.

The rigid portions 25 of the body 20 (aligned with the plurality of flanges 22) are less compliant than the compliant portions 26 of the body 20 (aligned with the plurality of openings 32). Portions 38 of the body 20 located between the fourth plurality of openings 34 in the compliant portions 26 act as torsion springs and allow the body 20 to be bent uniformly around the heated component.

A first connector 47 is located at a first end 48 of the body 20 and a second connector 49 is arranged at a second end 60 of the body 20. In some examples, the first connector 47 includes attachment portions 50 and 51 that extend outwardly from the body 20 and flanges 52 and 53 that extend radially outwardly, respectively. One or more recesses 61 can be provided at the first end 48 to allow the compliant guard to be installed without breaking fluid, gas and/or other connections to the component.

In some examples, the second connector 49 includes attachment portions 70 and 71 that extend outwardly from the body 20 and include flanges 72 and 73 that extend radially outwardly, respectively. The opposite end 68 of the body 20 further includes a portion 80 that extends from the body and includes a spacing flange 82 that extends radially inwardly when installed. The portion 80 is located radially inwardly of the first end 48 when arranged around the heated component.

The compliant heat guard 10 may include one or more recesses (such as recesses 83 and 89) that provide clearance for fluid and/or gas connections 87 to the component. The recesses 83 and 89 are located at ends of the compliant heat guard 10 to allow installation without requiring the fluid and/or gas connections 87 to be disconnected.

The plurality of flanges 22 and the spacing flanges 82 space the compliant guard radially outwardly relative to the component.

Figure 3:
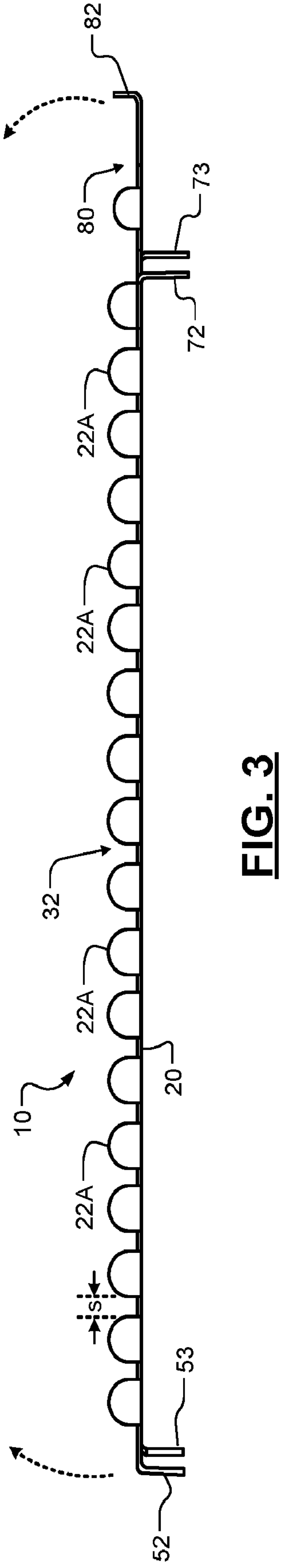
FIG. 3 is a side view of an example of the heat guard according to the present disclosure.

Referring now to FIG. 3, the flanges 52 and 53 and the flanges 72 and 73 extend radially outwardly when installed around the component. The spacing flange 82 extends radially inwardly. The first plurality of flanges 22A and the second plurality of flanges 22B extend first and second predetermined distances, respectively, from the body 20. In some examples, the first and second predetermined distances are the same. In other examples, the first and second predetermined distances are different. Alternately, selected ones of the first plurality of flanges 22A can have different heights relative to other ones of the first plurality of flanges 22A. Alternately, selected ones of the second plurality of flanges 22B can have different heights relative to other ones of the second plurality of flanges 22B. Variations in the heights can be used to accommodate components with nonuniform cross-sections.

As the body 20 is wrapped around the component, horizontal spacing "s" between radially inner edges of the plurality of flanges 22 decreases until sides of the plurality of flanges 22 are close to or abut one another. A height of the plurality of flanges 22 determines a distance between the body 20 and the component. In some examples, the spacing "s" is determined by an outer circumference of the component. As the body is wrapped around the component, the spacing "s" decreases.

The flanges shown in FIG. 3 are uniform and have a common height to accommodate a component with a generally uniform outer cross-section. However, the length and shape of some or all of the plurality of flanges 22 extending from the body 20 may be adjusted for components having other shapes such as rectangular, square, elliptical and/or non-uniform shapes. Examples of other shapes and lengths of the plurality of flanges 22 are shown below in FIGS. 6 and 7.

In some examples, the flange 52 is offset from the flange 53 and the flange 72 is offset horizontally from the flange 73 as shown in FIG. 3. In other examples, the flanges 52 and 53 and the flanges 72 and 73 are horizontally aligned.

Figure 5:
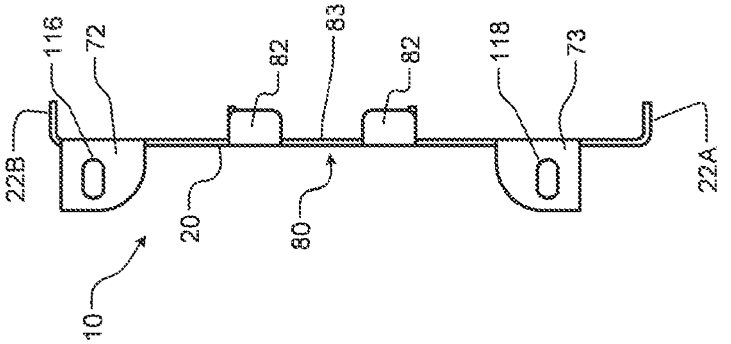
FIGS. 4 and 5 are end views of an example of the heat guard according to the present disclosure.
Figure 4:
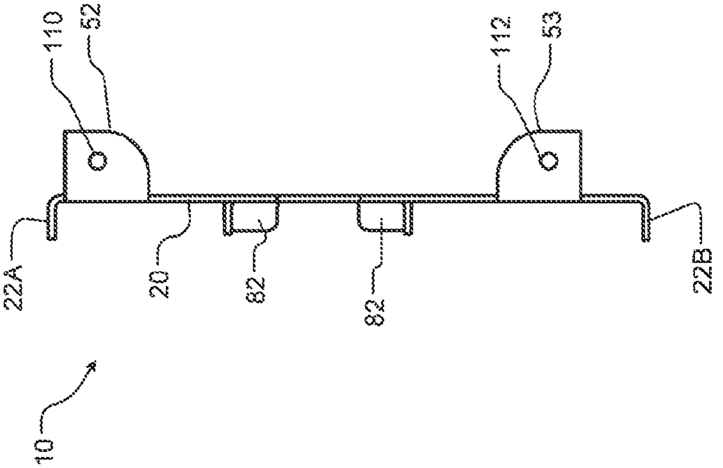

Referring now to FIGS. 1B, 4 and 5, the flanges 52 and 53 include bores 110 and 112, respectively. The flanges 72 and 73 also include bores 116 and 118, respectively. When the compliant heat guard 10 is wrapped around the component, fasteners (not shown) such as bolts are inserted through the bores 110 and 116 and 112 and 118 to fasten the compliant heat guard 10 to the component.

Figure 6:
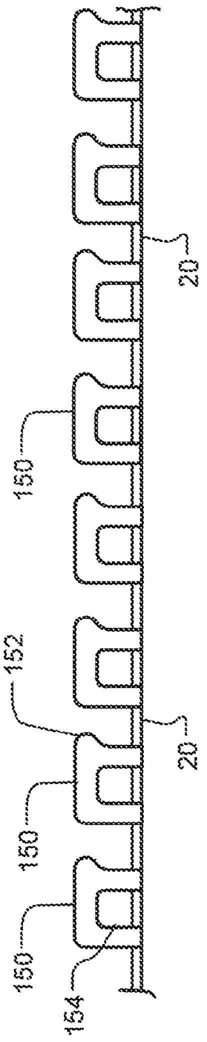
FIGS. 6 and 7 are side views illustrating additional examples of side flanges extending from a body of the heat guard according to the present disclosure.
Figure 7:
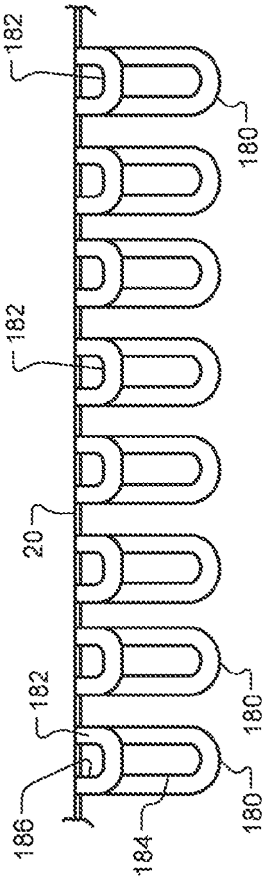

Referring now to FIGS. 6 and 7, the flanges extending from the sides can have different shapes to accommodate components with different shapes at different locations. In FIG. 6, a plurality of flanges 150 are located along a side surface of the body 20 and have a generally rectangular outer shape. In some examples, the plurality of flanges 150 include an opening 154 to allow convection. A protrusion 152 extends from one side thereof. The protrusion 152 defines (or further limits) spacing between adjacent ones of the plurality of flanges 150.

In FIG. 7, a first plurality of flanges 180 are located on one side of the body 20 and a second plurality of flanges 182 are located on an opposite side of the body 20. In some examples, the first plurality of flanges 180 have a "C"-shape and include an opening 184 to allow convection. The second plurality of flanges 182 have a "C"-shape and include an opening 186 to allow convection. The first plurality of flanges 180 are longer than the second plurality of flanges 182.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A guard configured to be installed around a component, comprising:

a body made of a flexible metal material and including first and second sides and first and second ends;

a first connector arranged at the first end;

a second connector arranged at the second end;

a first plurality of spacing flanges extending in a first direction from a first side of the body, wherein adjacent spacing flanges of the first plurality of spacing flanges have a predetermined spacing along the first side;

a second plurality of spacing flanges extending in the first direction from a second side of the body, wherein adjacent spacing flanges of the second plurality of spacing flanges on the second side are aligned with respective adjacent spacing flanges of the first plurality of spacing flanges on the first side;

a first plurality of openings in the body arranged between pairs of the first plurality of spacing flanges and the second plurality of spacing flanges;

a second plurality of openings extending inwardly from the first side of the body and arranged between the adjacent spacing flanges of the first plurality of spacing flanges;

a third plurality of openings extending inwardly from the second side of the body and arranged between the adjacent spacing flanges of the second plurality of spacing flanges; and a fourth plurality of openings in the body arranged between pairs of the second plurality of openings and the third plurality of openings, wherein the first and second ends are configured to flex towards each other to create an annular shape around the component.

2. The guard of claim 1, wherein:

the first connector includes first and second mounting flanges extending in a second direction from the body; and the second connector includes first and second mounting flanges extending in the second direction from the body, wherein the second direction is opposite to the first direction.

3. The guard of claim 2, further comprising:

a first portion extending from the second end of the body; and a spacing flange extending in the first direction from the first portion;

wherein when the body is wrapped around the component, the first portion is arranged between the first end of the body and the component, and the first connector and the second connector are connected together.

4. The guard of claim 1, wherein:

the first plurality of spacing flanges have a first height;

the second plurality of spacing flanges have a second height; and the first height is the same as the second height.

5. The guard of claim 1, wherein:

the first plurality of spacing flanges has a first height;

the second plurality of spacing flanges has a second height; and the first height is different than the second height.

6. The guard of claim 1, wherein each spacing flange of the first plurality of spacing flanges has a rectangular shape and includes an opening and a protrusion extending from one side thereof.

7. The guard of claim 1, wherein the body includes one or more recesses defined in at least one of the first end and the second end to provide clearance for a connection to the component.

8. The guard of claim 7, wherein an as-manufactured shape of the guard complies with a shape of the component on which the guard is installed and wherein the guard is configured to be installed on the component without breaking the connection to the component.

9. A guard configured to be installed around a component, comprising:

a body made of a flexible metal material and including first and second sides and first and second ends;

a first connector arranged at the first end of the body;

a second connector arranged at the second end of the body;

a plurality of rigid portions extending from the first side to the second side, wherein the plurality of rigid portions includes a plurality of spacing flanges arranged on the first side and the second side;

a plurality of second portions extending from the first side to the second side, wherein the plurality of rigid portions and the plurality of second portions alternate between the first end and the second end;

a first row of openings including a first plurality of openings extending from the first side to the second side and being aligned with the plurality of rigid portions; and a second row of openings including a second plurality of openings extending from the first side to the second side and being aligned with the plurality of second portions.

10. The guard of claim 9, wherein the plurality of spacing flanges include:

a first plurality of spacing flanges extending in a first direction from a first side of the body, wherein the first plurality of spacing flanges has a predetermined spacing along the first side; and a second plurality of spacing flanges extending in the first direction from a second side of the body, wherein the second plurality of spacing flanges on the second side are aligned with the first plurality of spacing flanges on the first side.

11. The guard of claim 10, wherein the first plurality of openings (24) in the body is arranged between pairs of the first plurality of spacing flanges and the second plurality of spacing flanges.

12. The guard of claim 10, wherein the plurality of second portions include:

a third plurality of openings extending inwardly from the first side of the body and arranged between adjacent spacing flanges of the first plurality of spacing flanges; and a fourth plurality of openings extending inwardly from the second side of the body and arranged between adjacent spacing flanges of the second plurality of spacing flanges.

13. The guard of claim 12, wherein the second plurality of openings (34) in the body is arranged between pairs of the third plurality of openings and the fourth plurality of openings.

14. The guard of claim 10, wherein:

the first connector includes a flange extending in a second direction from the body; and the second connector includes a flange extending in the second direction from the body.

15. The guard of claim 10, further comprising:

a first portion extending from the second end of the body; and a spacing flange extending in the first direction from the first portion, wherein when the body is wrapped around the component, the first portion is arranged between the first end of the body and the component, and the first connector and the second connector abut.

16. The guard of claim 10, wherein:

the first plurality of spacing flanges has a first height;

the second plurality of spacing flanges has a second height; and the first height is the same as the second height.

17. The guard of claim 10, wherein:

the first plurality of spacing flanges has a first height;

the second plurality of spacing flanges has a second height; and the first height is different than the second height.

18. The guard of claim 10, wherein each spacing flange of the first plurality of spacing flanges has a rectangular shape and includes an opening and a protrusion extending from one side thereof.

19. The guard of claim 9, wherein the body includes one or more recesses defined in at least one of the first end and the second end to provide clearance for a connection to the component.

20. The guard of claim 19, wherein an as-manufactured shape of the guard complies with a shape of the component on which the guard is installed and wherein the guard is configured to be installed without breaking the connection to the component.

* * * * *